(12) United States Patent
Lin et al.

(10) Patent No.: US 10,811,301 B2
(45) Date of Patent: *Oct. 20, 2020

(54) DUAL-ZONE HEATER FOR PLASMA PROCESSING

(71) Applicant: Applied Materials, Inc., Santa Clara, CA (US)

(72) Inventors: Xing Lin, San Jose, CA (US); Jianhua Zhou, Campbell, CA (US); Juan Carlos Rocha-Alvarez, San Carlos, CA (US); Ramprakash Sankarakrishnan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/660,385

(22) Filed: Oct. 22, 2019

(65) Prior Publication Data

US 2020/0051848 A1 Feb. 13, 2020

Related U.S. Application Data

(62) Division of application No. 15/009,345, filed on Jan. 28, 2016, now Pat. No. 10,497,606.

(Continued)

(51) Int. Cl.
*H01L 21/687* (2006.01)
*C23C 16/458* (2006.01)
(Continued)

(52) U.S. Cl.
CPC .... *H01L 21/68792* (2013.01); *C23C 16/4581* (2013.01); *C23C 16/4586* (2013.01);
(Continued)

(58) Field of Classification Search
CPC ......... H01L 21/68792; H01L 21/67103; H01L 21/67098; C23C 16/4586; C23C 16/4581; H01J 37/32724; H01J 37/32715
See application file for complete search history.

(56) References Cited

U.S. PATENT DOCUMENTS 5,935,334 A * 8/1999 Fong ................. H01J 37/32192
                                                     118/723 ME
5,968,379 A   10/1999 Zhao et al.
(Continued)

FOREIGN PATENT DOCUMENTS

CN      102844854 A    12/2012
CN      103928382 A     7/2014
(Continued)

OTHER PUBLICATIONS

Chinese Office Action for Application No. 201610083040.6 dated Mar. 3, 2020.

(Continued)

*Primary Examiner* — Jeffrie R Lund
*Assistant Examiner* — Mirza Israr Javed
(74) *Attorney, Agent, or Firm* — Patterson + Sheridan LLP

(57) ABSTRACT

A method and apparatus for a pedestal is provided. In one embodiment, the pedestal includes a body comprising a ceramic material having a flange, one or more heating elements embedded in the body, a first shaft coupled to the flange, and a second shaft coupled to the first shaft; wherein the second shaft includes a plurality of fluid channels formed therein that terminate in the second shaft.

18 Claims, 10 Drawing Sheets

Related U.S. Application Data

(60) Provisional application No. 62/113,941, filed on Feb. 9, 2015.

(51) Int. Cl.
*H01J 37/32* (2006.01)
*H01L 21/67* (2006.01)

(52) U.S. Cl.
CPC .. *H01J 37/32715* (2013.01); *H01J 37/32724* (2013.01); *H01L 21/67103* (2013.01)

(56) References Cited

U.S. PATENT DOCUMENTS

| | | | | |
|---|---|---|---|---|
| 6,081,414 A | * | 6/2000 | Flanigan | H01L 21/6831 361/234 |
| 6,652,655 B1 | * | 11/2003 | Ho | C23C 16/4586 118/725 |
| 6,977,804 B2 | * | 12/2005 | Yanagida | C23C 16/4586 361/234 |
| 7,436,645 B2 | * | 10/2008 | Holland | H01L 21/67103 361/230 |
| 8,279,577 B2 | * | 10/2012 | Nguyen | H01J 37/32871 361/234 |
| 8,512,509 B2 | * | 8/2013 | Bera | H01J 37/321 156/345.34 |
| 8,790,007 B2 | | 7/2014 | Goto | |
| 8,955,579 B2 | * | 2/2015 | Tandou | F25B 39/02 165/104.33 |
| 8,971,009 B2 | | 3/2015 | Parkhe et al. | |
| 9,725,806 B2 | | 8/2017 | Lin et al. | |
| 2002/0050246 A1 | | 5/2002 | Parkhe | H01L 21/67109 118/500 |
| 2003/0164226 A1 | * | 9/2003 | Kanno | H01L 21/67109 156/345.51 |
| 2005/0219786 A1 | * | 10/2005 | Brown | H01L 21/6831 361/234 |
| 2008/0121582 A1 | * | 5/2008 | Morris | B01D 35/301 210/455 |
| 2009/0159566 A1 | * | 6/2009 | Brillhart | C23C 14/505 216/58 |
| 2010/0193501 A1 | * | 8/2010 | Zucker | H01L 21/67248 219/443.1 |
| 2011/0154843 A1 | * | 6/2011 | Ko | H01L 21/6831 62/259.2 |
| 2011/0180243 A1 | * | 7/2011 | Bera | F28F 3/12 165/168 |
| 2012/0074126 A1 | * | 3/2012 | Bang | H01L 21/68785 219/443.1 |
| 2013/0284372 A1 | * | 10/2013 | Tavassoli | H01L 21/67109 156/345.29 |
| 2014/0209596 A1 | * | 7/2014 | Lubomirsky | H01L 21/67098 219/465.1 |
| 2015/0047975 A1 | * | 2/2015 | West | H01J 37/3426 204/298.07 |
| 2015/0364354 A1 | * | 12/2015 | Tantiwong | H01L 21/67248 156/345.34 |
| 2015/0380220 A1 | * | 12/2015 | Tan | H01J 37/32724 216/67 |
| 2016/0230281 A1 | * | 8/2016 | Lin | H01J 37/32724 |
| 2017/0010046 A1 | * | 1/2017 | Hofbauer | F28F 1/04 |
| 2018/0142352 A1 | * | 5/2018 | Shah | C23C 16/45565 |
| 2020/0010163 A1 | * | 1/2020 | Taylor | B63H 20/32 |
| 2020/0051784 A1 | * | 2/2020 | Galstyan | H01J 37/32082 |
| 2020/0111640 A1 | * | 4/2020 | Shim | H01L 21/67103 |

FOREIGN PATENT DOCUMENTS

| | | |
|---|---|---|
| JP | H10256244 A | 9/1998 |
| JP | H11043773 A | 2/1999 |
| JP | 200293894 A | 3/2002 |
| JP | 2002110774 A | 4/2002 |
| JP | 2002509989 A | 4/2002 |
| JP | 2014534614 A | 12/2014 |
| KR | 20110061188 A | 6/2011 |
| TW | 365021 B | 7/1999 |

OTHER PUBLICATIONS

Japanese Office Action for Application No. JP 2016-021481 dated Mar. 10, 2020.
Taiwan Office Action dated Apr. 2, 2019 for Application No. 105103322.
Chinese Office Action for Application No. CN 201710515830.1 dated May 26, 2020.
Japan Notice of Decision to Grant Patent for Application No. JP 2016-021481 dated Jun. 23, 2020.
Chinese Office Action for Application No. CN 201710515830.1 dated Nov. 8, 2019.

* cited by examiner

DUAL-ZONE HEATER FOR PLASMA PROCESSING

CROSS-REFERENCE TO RELATED APPLICATIONS

This application is a divisional of U.S. patent application Ser. No. 15/009,345, filed Jan. 28, 2016, which application claims priority to U.S. Provisional Patent Application Ser. No. 62/113,941, filed on Feb. 9, 2015, which are hereby incorporated by reference herein.

BACKGROUND

Field

Embodiments disclosed herein generally relate to a semiconductor processing chamber and, more specifically, a heated support pedestal for a semiconductor processing chamber having multi-zone temperature control.

Description of the Related Art

Semiconductor processing involves a number of different chemical and physical processes enabling minute integrated circuits to be created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

In the manufacture of integrated circuits, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

The processing chambers used in these processes typically include a substrate support or pedestal disposed therein to support the substrate during processing. In some processes, the pedestal may include an embedded heater adapted to control the temperature of the substrate and/or provide elevated temperatures that may be used in the process. Conventionally, the pedestals may be made of a ceramic material, which generally provide desirable device fabrication results.

However, ceramic pedestals create numerous challenges. One of these challenges is multiple zone heating and/or accurate temperature control of the pedestal and substrate during processing.

Therefore, what is needed is a pedestal that is temperature-controlled in multiple zones.

SUMMARY

A method and apparatus for a heated pedestal is provided. In one embodiment, the pedestal includes a body comprising a ceramic material having a flange, one or more heating elements embedded in the body, a first shaft coupled to the flange, and a second shaft coupled to the first shaft; wherein the second shaft includes a plurality of fluid channels formed therein that terminate in the second shaft.

In another embodiment, a pedestal for a semiconductor processing chamber is provided. The pedestal includes a body comprising a ceramic material, a plurality of heating elements encapsulated within the body, a first shaft coupled to the body, and a second shaft coupled to the first shaft; wherein the second shaft includes a plurality of fluid channels formed therein, at least a portion of the fluid channels terminating in the second shaft.

In another embodiment, a pedestal for a semiconductor processing chamber is provided. The pedestal includes a body comprising a ceramic material, a plurality of heating elements encapsulated within the body, a first shaft coupled to the body, and a second shaft coupled to the first shaft; wherein the second shaft includes a plurality of fluid channels formed therein, at least a portion of the fluid channels terminating in the second shaft, and wherein the first shaft is made of a first material and the second shaft is made of a second material that is different than the first material.

BRIEF DESCRIPTION OF THE DRAWINGS

So that the manner in which the above-recited features of the present disclosure can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of its scope, for the embodiments disclosed herein may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure are illustratively described below in reference to plasma chambers, although embodiments described herein may be utilized in other chamber types and in multiple processes. In one embodiment, the plasma chamber is utilized in a plasma enhanced chemical vapor deposition (PECVD) system. Examples of PECVD systems that may be adapted to benefit from the disclosure include a PRODUCER® SE CVD system, a PRODUCER® GT™ CVD system or a DXZ® CVD system, all of which are commercially available from Applied Materials, Inc., Santa Clara, Calif. The Producer® SE CVD system chamber (e.g., 200 mm or 300 mm) has two isolated processing regions that may be used to deposit thin films on substrates, such as conductive films, oxide films such as silicon oxide films, carbon-doped silicon oxides and other materials. Although the exemplary embodiment includes two processing regions, it is contemplated that embodiments disclosed herein may be used to advantage in systems having a single processing region or more than two processing regions. It is also contemplated that embodiments disclosed herein may be utilized to advantage in other plasma chambers, including etch chambers, ion implantation chambers, plasma treatment chambers, and in resist stripping chambers, among others. It is further contemplated that embodiments disclosed herein may be utilized to advantage in plasma processing chambers available from other manufacturers.

Figure 1:
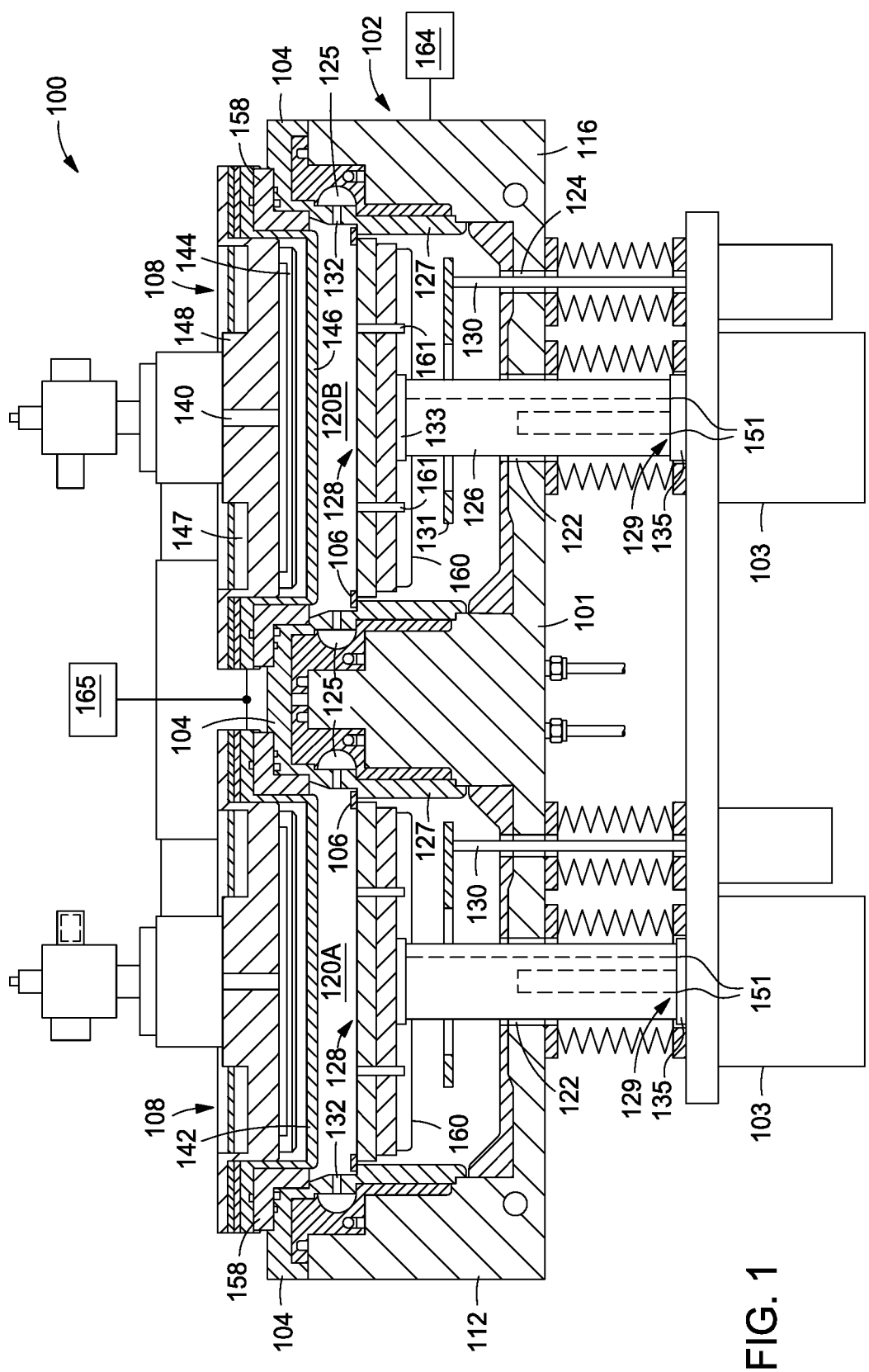
FIG. 1 is a partial cross-sectional view of one embodiment of a plasma system.

FIG. 1 is a partial cross-sectional view of a plasma system 100. The plasma system 100 generally comprises a processing chamber body 102 having sidewalls 112, a bottom wall 116 and a shared interior sidewall 101 defining a pair of processing regions 120A and 120B. Each of the processing regions 120A, 120B is similarly configured, and for the sake of brevity, only components in the processing region 120B will be described.

A pedestal 128 is disposed in the processing region 120B through a passage 122 formed in the bottom wall 116 in the system 100. The pedestal 128 provides a heater adapted to support a substrate (not shown) on the upper surface thereof. The pedestal 128 may include heating elements, for example resistive heating elements, to heat and control the substrate temperature at a desired process temperature. Alternatively, the pedestal 128 may be heated by a remote heating element, such as a lamp assembly.

The pedestal 128 is coupled by a flange 133 to a stem 126. The stem 126 couples the pedestal 128 to a power outlet or power box 103. The power box 103 may include a drive system that controls the elevation and movement of the pedestal 128 within the processing region 120B. The stem 126 also contains electrical power interfaces to provide electrical power to the pedestal 128. The power box 103 also includes interfaces for electrical power and temperature indicators, such as a thermocouple interface. The stem 126 also includes one or more coolant channels 151. The stem 126 also includes a base assembly 129 adapted to detachably couple to the power box 103 thereto. The coolant channels 151 may extend to the pedestal 128, terminate within the stem 126, or combinations thereof. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 of the processing region 120B and is utilized to position substrate lift pins 161 disposed through the pedestal 128. The rod 130 is coupled to a lift plate 131 that contacts the lift pins 161. The substrate lift pins 161 selectively space the substrate from the pedestal to facilitate exchange of the substrate with a robot (not shown) utilized for transferring the substrate into and out of the processing region 120B through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120B. The showerhead assembly 142 includes an annular base plate 148 having a blocker plate 144 disposed intermediate to a faceplate 146. A radio frequency (RF) source 165 is coupled to the showerhead assembly 142. The RF source 165 powers the showerhead assembly 142 to facilitate generation of a plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120B in very close proximity to the sidewalls 101, 112 of the chamber body 102 to prevent exposure of the sidewalls 101, 112 to the processing environment within the processing region 120B. The liner assembly 127 includes a circumferential pumping cavity 125 that is coupled to a pumping system 164 configured to exhaust gases and byproducts from the processing region 120B and control the pressure within the processing region 120B. A plurality of exhaust ports 132 may be formed on the chamber liner assembly 127. The exhaust ports 132 are configured to allow the flow of gases from the processing region 120B to the circumferential pumping cavity 125 in a manner that promotes processing within the system 100.

Embodiments of the disclosure provide method and apparatus to design a temperature-controlled zone ceramic heater (i.e., the pedestal 128 as described herein) and control thereof to achieve ultimate temperature uniformity and real-time temperature tuning capability in RF plasma environments. The configurations of the coolant channels 151, described in more detail below, enables temperature control of the pedestal 128. The pedestal 128 is not limited to use in CVD/PECVD processing chamber and may be used in PVD and etch semiconductor processing chambers.

Conventional heaters have limited cooling capability that cannot control the heater temperature with high RF power condition. The heat loss from conventional heaters is not enough to compensate the heat provided by RF plasma when controlling the heater temperature at about 260 degrees Celsius, and above. Meanwhile, in a conventional dual zone heater, only one thermocouple is enclosed in the center of ceramic heater. The outer zone heater temperature is calculated by measuring outer zone heating elements. A required specific power is provided to the heater in order to obtain a heating element resistance and then achieve an appropriate temperature resolution. This power will raise the temperature of the heater, although the heater is required to stay cool during plasma processing. Furthermore, the configuration of an RF mesh, serving as a ground plate or plate electrode in the heater, affects RF coupling of a substrate. The RF coupling in conventional heaters, especially in the region of the mesh where the lift pin holes are located, is limited.

Figure 2:
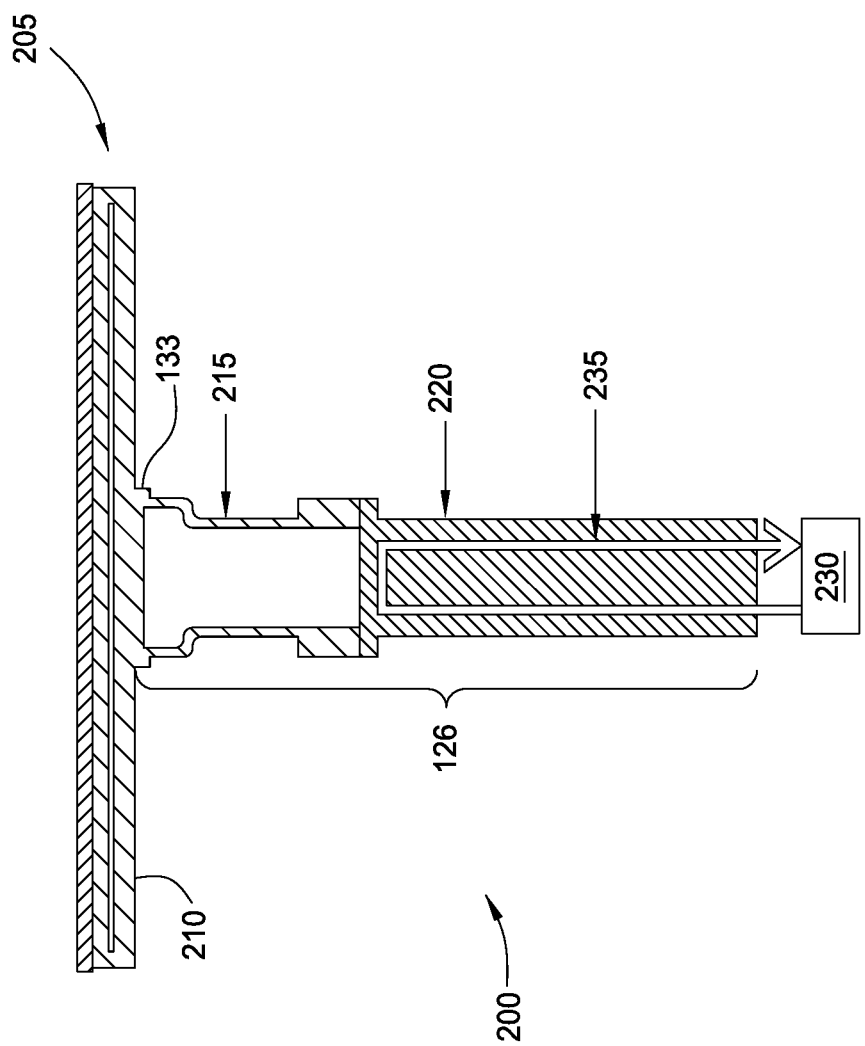
FIG. 2 is a schematic cross-sectional view of one embodiment of a pedestal that may be utilized in the plasma system of FIG. 1.

FIG. 2 is a schematic cross-sectional view of one embodiment of a pedestal 200 that may be utilized as the pedestal 128 in the plasma system 100 of FIG. 1. The pedestal 200 includes a heater body 205 coupled to a stem 126. The heater body 205 includes a heating element 210 embedded inside the heater body 205. The heater body 205 may comprise a ceramic material, such as an aluminum nitride material, or other ceramic material. The stem 126 in this embodiment is a two-piece assembly and includes a first shaft 215 coupled to a flange 133, and a second shaft 220 coupled to the first shaft 215. The first shaft 215 and the second shaft 220 may be made of different materials that conduct heat away from the heater body 205. For example, the first shaft 215 may be made of a material having a first thermal conductivity property that is different than a second thermal conductivity property of the material of the second shaft 220. The first shaft 215 may be made of aluminum nitride and the second shaft may be made of aluminum. The first shaft 215 may be diffusion bonded to the heater body 205, for example, diffusion bonded to the flange 133.

In some plasma processes performed in the plasma system 100 of FIG. 1, the temperature of the pedestal 200 during plasma processing is about 260 degrees Celsius. The pedestal 200 may be heated by a combination of power provided to the heating element 210 embedded inside the heater body 205 as well as heat obtained from plasma during a process in the processing regions 120A and 120B of FIG. 1. In many cases, the temperature of the heater body 205 cannot be maintained and may elevate to a temperature above about 260 degrees Celsius.

As shown in FIG. 2, a coolant 230, such as ethylene glycol mixed with water, a GALDEN® fluid, or a gas, is flowed through the second shaft 220 in order to reduce the temperature of the heater body 205. Alternatively or additionally, a length of the first shaft 215 may be shortened to position the second shaft 220 closer to the heater body 205, which may improve the cooling capability. The coolant may flow in a hollow portion, such as a conduit 235, which may be one of the coolant channels 151 shown and described in FIG. 1, of the second shaft 220.

Figure 3B:
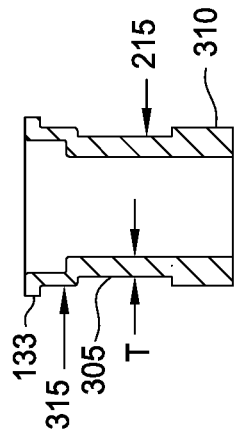
FIGS. 3B-3D are cross-sectional views of alternative embodiments of a first shaft of the pedestal of FIG. 3A.
Figure 3C:
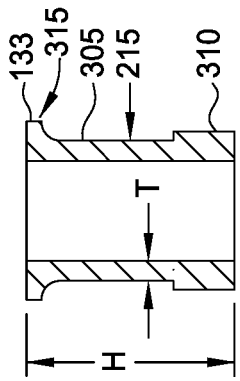
Figure 3D:
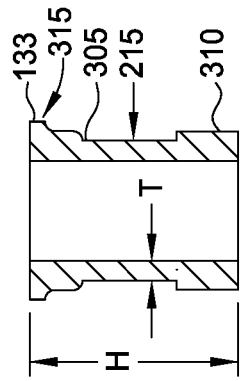
Figure 3A:
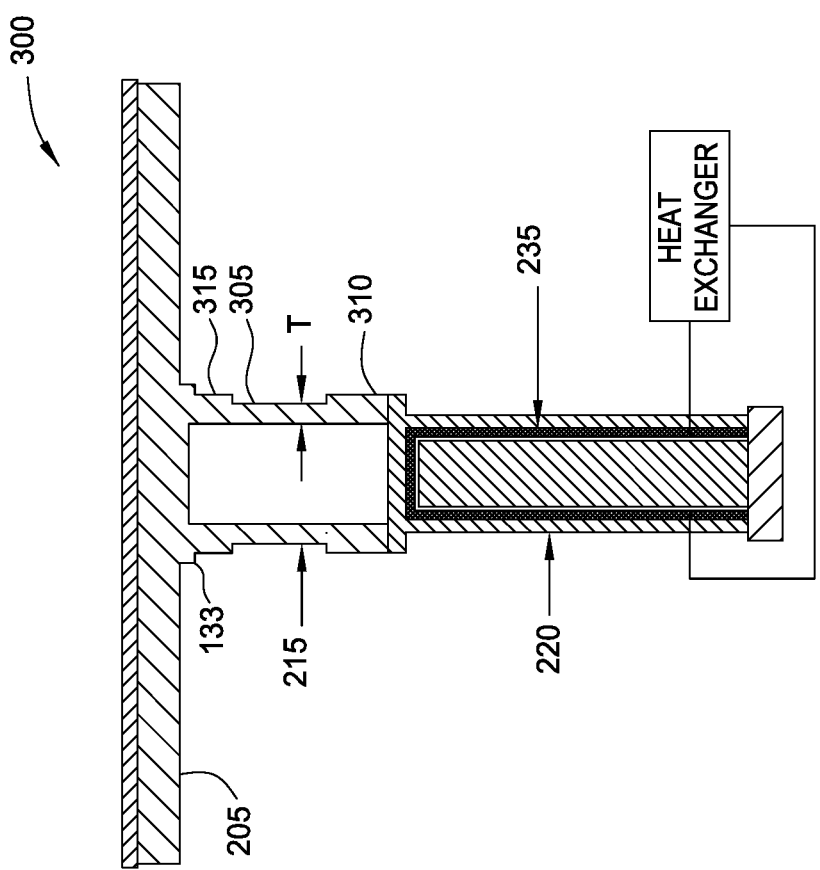
FIG. 3A is a schematic cross-sectional view of another embodiment of a pedestal that may be utilized in the plasma system of FIG. 1.

FIG. 3A is a schematic cross-sectional view of another embodiment of a pedestal 300 that may be utilized as the pedestal 128 in the plasma system 100 of FIG. 1. The pedestal 300 may be an alternative or additional aspect to the pedestal 200 shown in FIG. 2. According to this embodiment, the design of first shaft 215 may be adapted to increase thermal conduction. For example, a thickness T of a wall 305 of the first shaft 215 may be increased from about 0.1 inches up to about 0.4 inches as compared to the first shaft 215 in FIG. 2. Increasing the thickness T of the wall 305 may be used to increase thermal flux from the heater body 205 to the second shaft 220. Alternatively or additionally, an interface 310 where the first shaft 215 and the second shaft 220 are coupled, may be configured to have increased surface area (e.g., an increased thickness and/or cross-section) to further increase thermal conduction of the stem 126. An interface 315, where the first shaft 215 and the flange 133 are coupled, may also be configured to have an increased surface area (e.g., an increased thickness and/or cross-section) to maximize conduction of heat away from the heater body 205. The increased surface area may include increasing the cross-sectional area of both of the first shaft 215 and the second shaft 220, and may also simplify the shaft design as well as improve the mechanical connection at the interfaces 310 and/or 315. A coolant channel, such as a conduit 235, is also shown in the second shaft 220. The conduit 235 may be in fluid communication with a heat exchanger. The heat exchanger may be chilled to improve heat removal from a fluid flowing in the conduit 235.

FIGS. 3B-3D are cross-sections of alternative embodiments of the first shaft 215 where a height H may be varied alone or in combination with the thickness T of the wall 305. Variations in the height H of the first shaft 215 may be used to increase thermal flux from the heater body 205 to the second shaft 220. Additionally or alternatively, the shape of the interface 315 may be varied to increase thermal conduction and/or increase thermal flux from the heater body 205 to the second shaft 220.

Figure 4A:
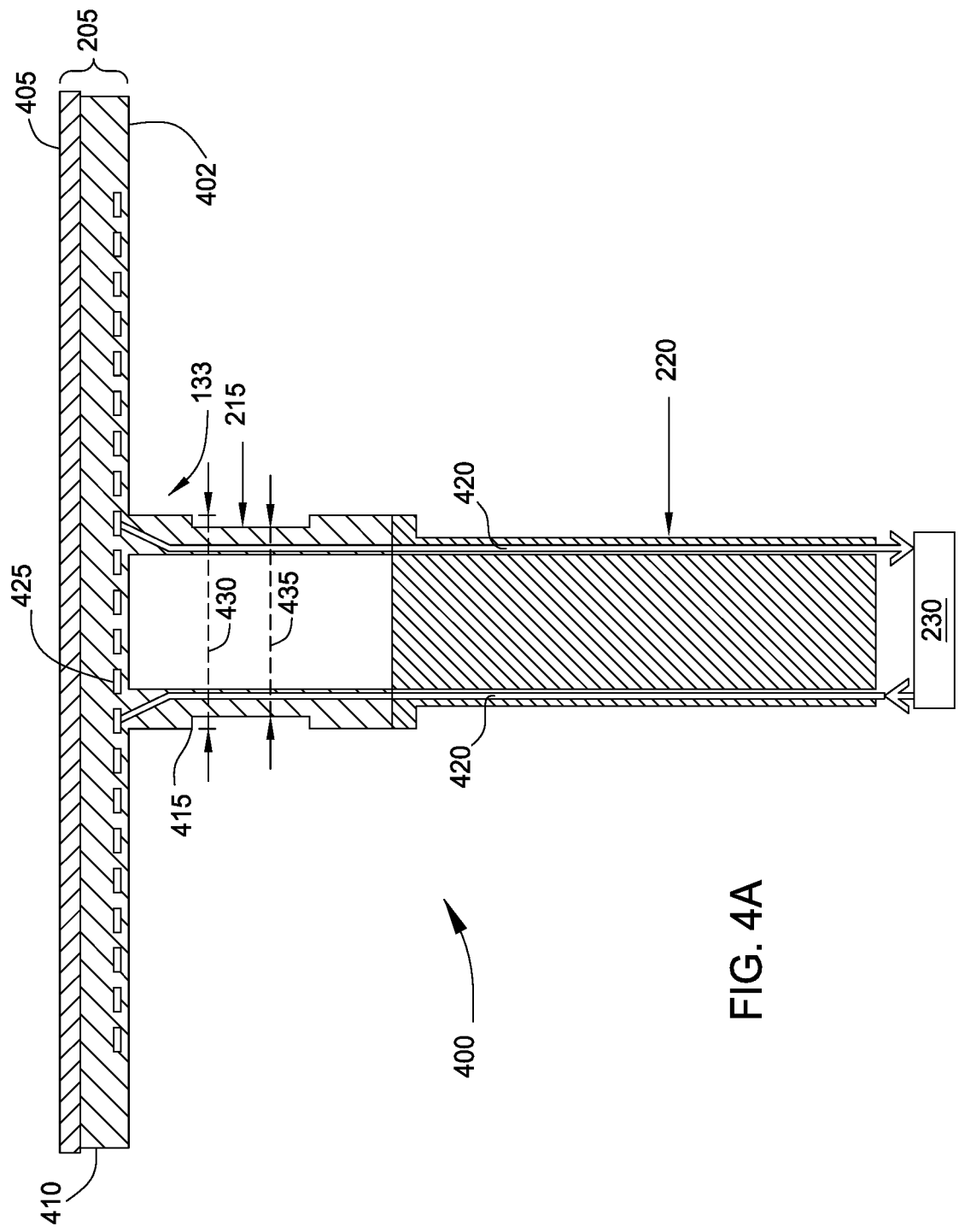
FIG. 4A is a schematic cross-sectional view of another embodiment of a pedestal that may be utilized in the plasma system of FIG. 1.

FIG. 4A is a schematic cross-sectional view of another embodiment of a pedestal 400 that may be utilized as the pedestal 128 in the plasma system 100 of FIG. 1. In this embodiment, the pedestal 400 includes an active coolant feed, using a liquid or a gas, as a coolant 230. The pedestal 400 as described and shown in FIGS. 4A-4C features a closed loop active water cooling or gas feed which removes heat from the heater body 205 and/or on a substrate (not shown). The cooling of pedestal 400 can be dramatically improved by directly flowing a coolant 230 into a lower portion 402 of the heater body 205. One or more flow channels 420 may be formed in side walls of the first shaft 215 and the second shaft 220, and flowed to a coolant channel 425, which may be one of the coolant channels 151 shown and described in FIG. 1, formed in the heater body 205. In some embodiments, the heater body 205 may include a first plate 405 and a second plate 410 that are bonded together. The coolant channel 425 may be formed in one or both of the first plate 405 and the second plate 410. The plates 405, 410 may be joined by diffusion bonding. A flange 133 of the pedestal 400, where the first shaft 215 couples to the heater body 205, may also include a shoulder 415. The shoulder 415 includes a dimension 430 (e.g., a diameter) that is greater than a dimension 435 (e.g., a diameter) of the first shaft 215. The shoulder 415 may be used to increase conduction of heat away from the heater body 205 which may reduce cold spots in the heater body 205.

Figure 4B:
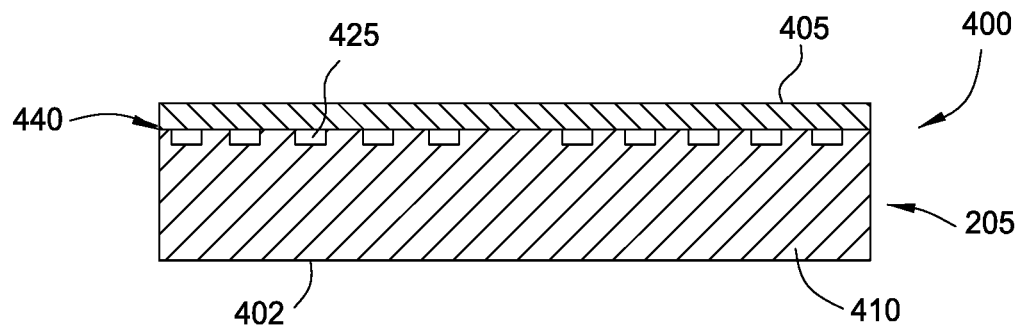
FIG. 4B is a partial side cross-sectional view of the pedestal shown in FIG. 4A.

FIG. 4B is a partial side cross-sectional view of the pedestal 400 shown in FIG. 4A showing an alternate location of the coolant channel 425 that is embedded in the heater body 205. The coolant channel 425 according to this embodiment is positioned at an interface 440 of the first plate 405 and the second plate 410.

Figure 4C:
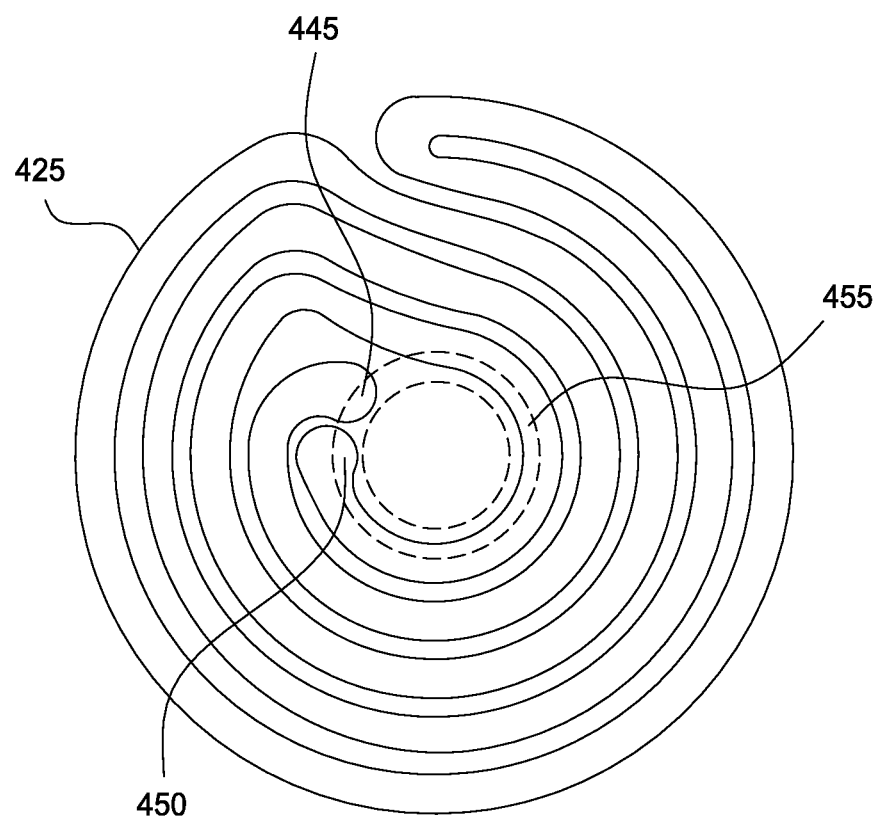
FIG. 4C is a plan view of one embodiment of a coolant channel.

FIG. 4C is a plan view of one embodiment of the coolant channel 425 that is embedded in the heater body 205. The coolant channel 425 includes a substantially circular fluid path having an inlet 445 and an outlet 450. A sidewall 455 of the first shaft 215 (shown in FIG. 4A) is shown in phantom near a center of the coolant channel 425. The inlet 445 and the outlet 450 are substantially aligned with the sidewall 455 such that the one or more flow channels 420 (shown in FIG. 4A) may be in communication therewith.

Figure 5:
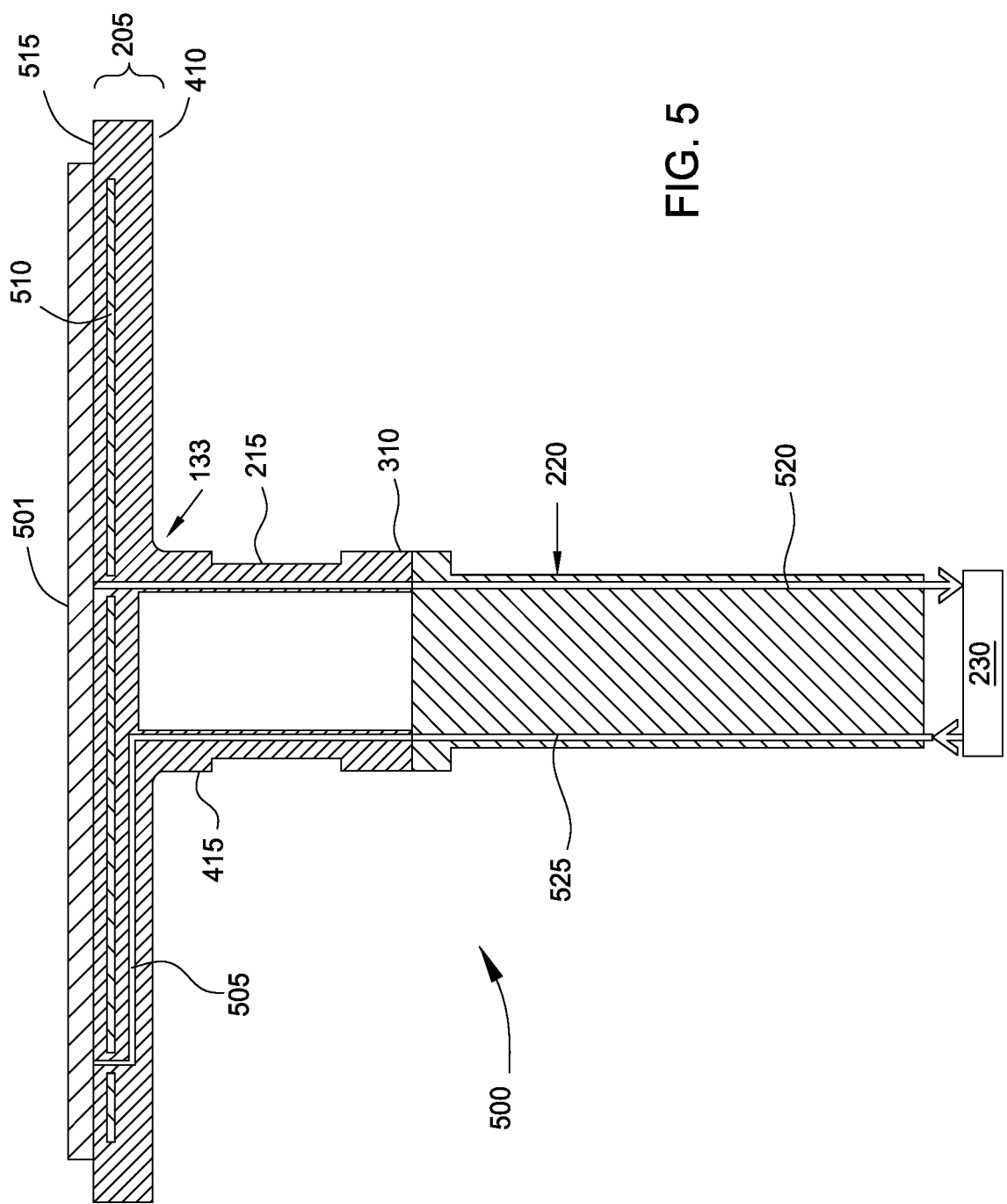
FIG. 5 is a schematic cross-sectional view of another embodiment of a pedestal that may be utilized in the plasma system of FIG. 1.

FIG. 5 is a schematic cross-sectional view of another embodiment of a pedestal 500 that may be utilized as the pedestal 128 in the plasma system 100 of FIG. 1. In this embodiment, the pedestal 500 includes backside cooling and chucking capability. The pedestal 500 includes one or both of an inner gas channel 520 and an outer gas channel 525 in communication with a coolant 230. The inner gas channel 520 and the outer gas channel 525 may comprise the coolant channels 151 shown and described in FIG. 1. Other gas channels may be included. The inner gas channel 520 may be used to provide a cooling gas to a center region of the heater body 205 to cool a substrate 501. The outer gas channel 525 may be used to provide a cooling gas to an edge of the heater body 205 to cool an edge of the substrate 501. The cooling gas comprising the coolant 230 may be helium, argon or nitrogen, or combinations thereof, among other gases. The inner gas channel 520 and the outer gas channel 525 may be formed in the sidewall of the first shaft 215 and the second shaft 220 and each may form a closed loop fluid line. The inner gas channel 520 and the outer gas channel 525 may be formed to allow gas to leak to the vacuum chamber (e.g., the processing regions 120A and 120B of FIG. 1) around the edge of the substrate 501. One or more channels 505 may be formed in or on one or both of the first plate 405 and the second plate 410 of the heater body 205. The pedestal 500 provides highly flexible temperature tunability of the substrate 501 during processing in order to actively control the substrate temperature using a single or dual gas feed. The dual zone backside gas configuration provided by the inner gas channel 520 and the outer gas channel 525 provides an efficient node for center to edge temperature tunability of the substrate 501.

The pedestal 500 may also include a RF mesh 510 which serves a chucking electrode. Small holes formed in the first plate 405 may be used to allow gas leakage to a top surface 515 of the heater body 205. The electrostatic chuck also allows gas to pass between the substrate 501 and the top surface 515 and leak about the edge of the substrate 501.

Figure 6:
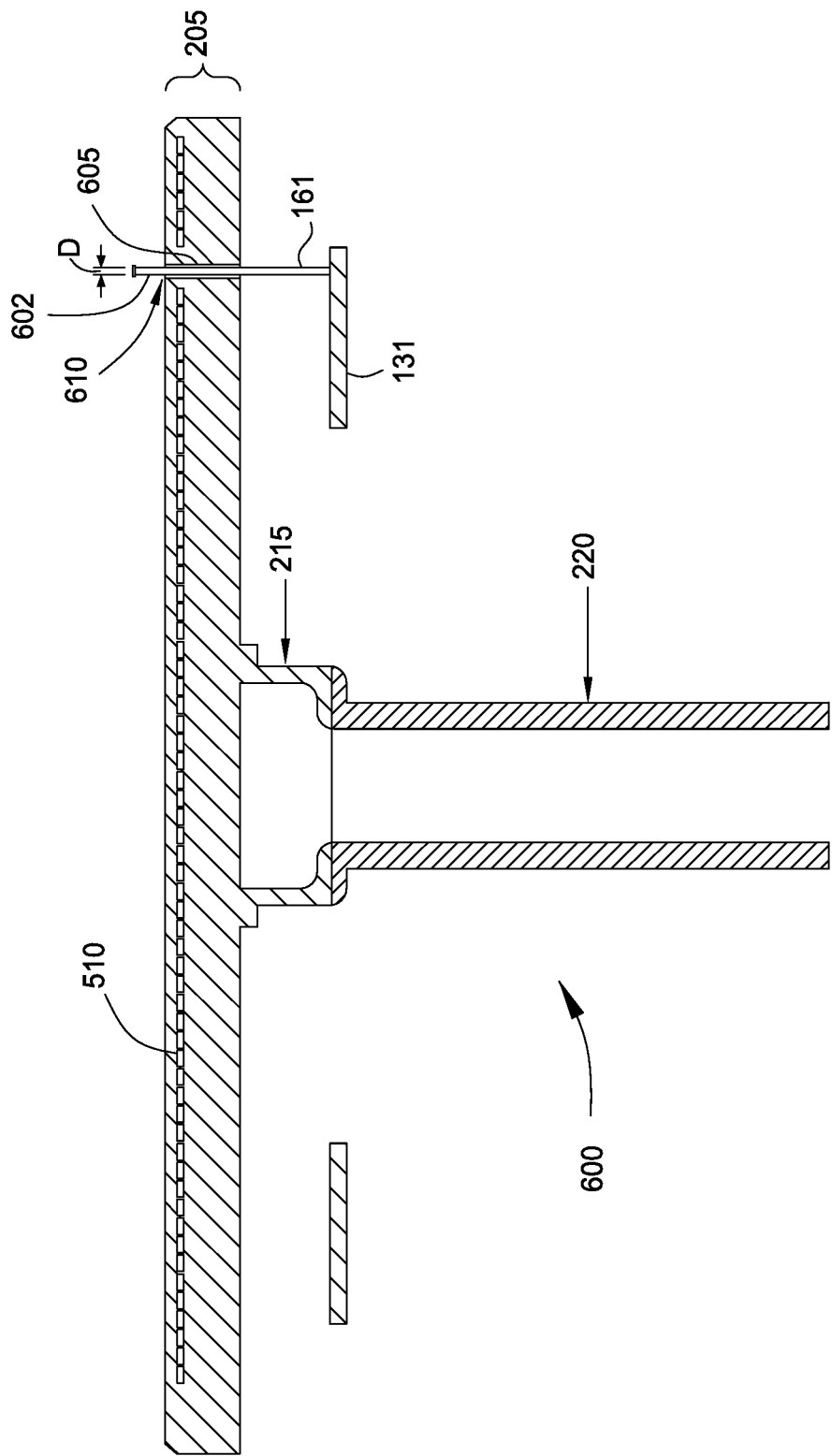
FIG. 6 is a schematic cross-sectional view of another embodiment of a pedestal that may be utilized in the plasma system of FIG. 1.

FIG. 6 is a schematic cross-sectional view of another embodiment of a pedestal 600 that may be utilized as the pedestal 128 in the plasma system 100 of FIG. 1. In this embodiment, the lift pins 161 (only one is shown) have a shaft 602 with minimal diameter D as compared to conventional lift pins. The minimized diameter of the shaft 602 of the lift pin 161 provides for a smaller (lesser diameter) lift pin guide 605 in the heater body 205. The minimized size of the lift pin guide 605 provides an opening 610 formed in the RF mesh 510 to be smaller than openings in RF mesh in conventional pedestals. The minimized opening 610 provides enhanced RF coupling, especially in the area of the lift pins. In one embodiment, the diameter D is less than about 0.01 inches.

Figure 7:
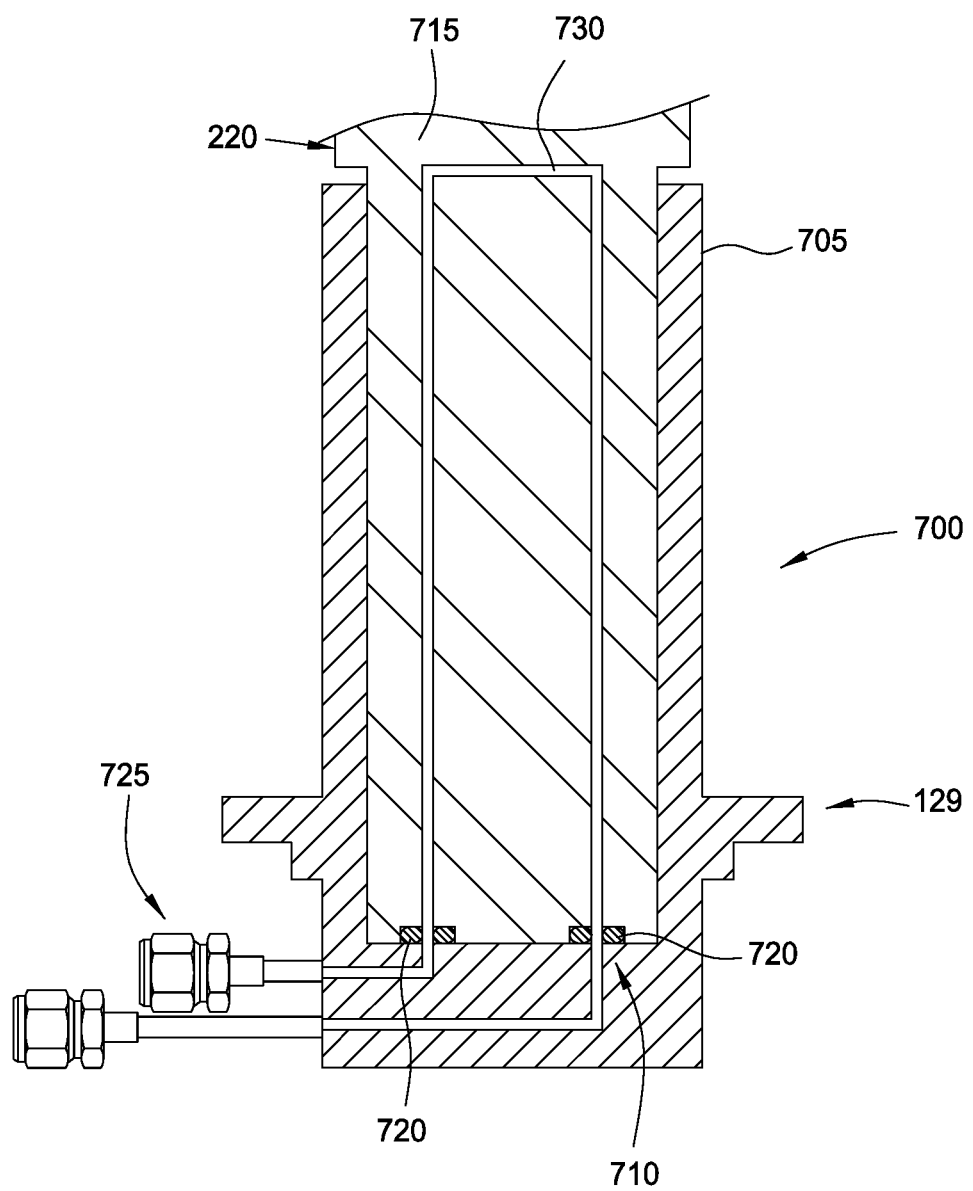
FIG. 7 is a schematic cross-sectional view of one embodiment of a portion of a pedestal that may be utilized in the plasma system of FIG. 1.

FIG. 7 is a schematic cross-sectional view of one embodiment of a portion of a pedestal 700 that may be utilized as the pedestal 128 in the plasma system 100 of FIG. 1. The pedestal 700 includes a portion of the second shaft 220 coupled to a base assembly 129. The base assembly 129 includes a tubular mating member 705 having an opening 710 that receives at least a portion of the second shaft 220 that is configured as an insert 715. The tubular mating member 705 may be a sleeve that at least partially surrounds the second shaft 220. In some embodiments, the tubular mating member 705 completely surrounds a peripheral surface of the second shaft 220. The tubular mating member 705 may be made of aluminum.

In one embodiment, the insert 715 may be made of aluminum. The second shaft 220 is sized slightly smaller than the opening 710 to provide contact between the insert 715 and the tubular mating member 705. According to this embodiment, the coolant inlet of the second shaft 220 has a surface contact with a cooling base (e.g., the base assembly 129). O-rings 720 may be used to provide a seal between the base assembly 129 and the second shaft 220. Connectors 725 of the fluid feed are located at the side of the base assembly 129, which reserves space for other features like terminals and filters (not shown). The insert 715 may also include a fluid channel 730 which may be one of the coolant channels 151 shown and described in FIG. 1.

Figure 8A:
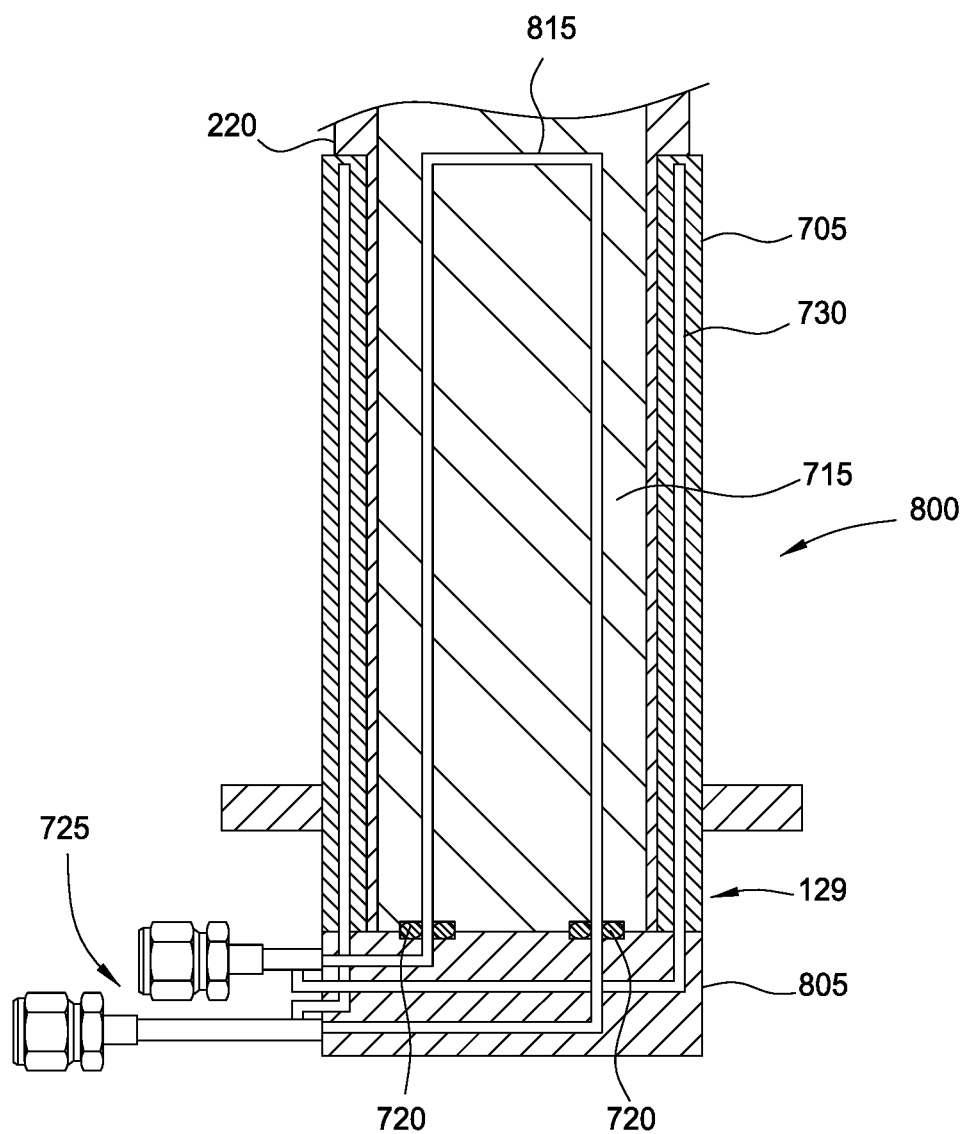
FIG. 8A is schematic cross-sectional view of another embodiment of a portion of a pedestal that may be utilized in the plasma system of FIG. 1.
Figure 8B:
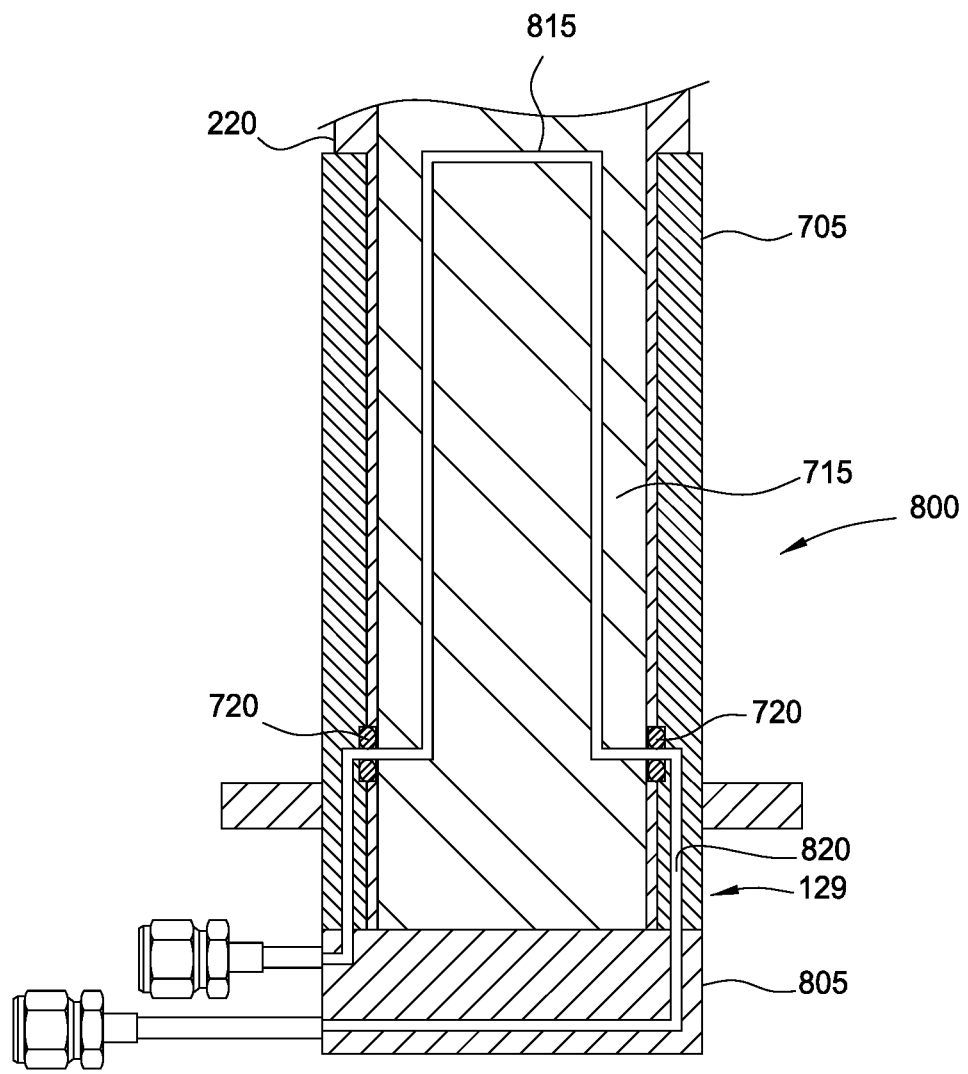
FIG. 8B is schematic cross-sectional view of another embodiment of a portion of a pedestal that may be utilized in the plasma system of FIG. 1.

FIGS. 8A and 8B are schematic cross-sectional views of another embodiment of a portion of a pedestal 800 that may be utilized in the plasma system of FIG. 1. The second shaft 220 has surface contact with a cooling base 805 adjacent to the sidewall of the second shaft 220. Additionally, the pedestal 800 includes the insert 715 which includes a fluid channel 815 formed therein. In some embodiments, the tubular mating member 705 includes a fluid channel 730 formed in a side wall thereof similar to the embodiment of FIG. 7. The fluid channel 815 and the fluid channel 730 may be the coolant channels 151 shown and described in FIG. 1. Both of the fluid channel 730 and the fluid channel 815 may be a closed loop fluid path (e.g., coupled to separate coolant sources (not shown)). Alternatively, both of the fluid channel 730 and the fluid channel 815 may be coupled to a common coolant source (not shown).

FIG. 8B is an alternative embodiment of the pedestal 800 of FIG. 8A. In this embodiment, the fluid channel 815 formed in the insert 715 is fluidly coupled to a fluid channel 820 formed in the insert 715 adjacent to the base assembly 129.

Embodiments of a pedestal described herein provide a multi-zone heater that provides more efficient heat control as well as a wider range of temperature tunability. Low temperature maintenance may also be enhanced, which increases the applicability of the pedestal to low temperature film formation processes.

While the foregoing is directed to embodiments of the disclosure, other and further embodiments of the disclosure may be devised without departing from the basic scope thereof, and the scope thereof is determined by the claims that follow.

The invention claimed is:

1. A pedestal for a semiconductor processing chamber, comprising:
   a body comprising a ceramic material;
   a plurality of heating elements encapsulated within the body;
   a first shaft coupled to the body; and
   a second shaft coupled to the first shaft, wherein the second shaft includes a plurality of fluid channels formed therein, at least a portion of the fluid channels terminating in the second shaft, wherein the first shaft is made of a first material and the second shaft is made of a second material that is different than the first material, and wherein the plurality of fluid channels comprise a first set of fluid channels and the pedestal includes a second set of fluid channels formed in the first shaft and the second shaft.

2. The pedestal of claim 1, wherein the second shaft is at least partially surrounded by a sleeve.

3. The pedestal of claim 1, wherein one or more of the second set of fluid channels terminate in the body.

4. The pedestal of claim 1, wherein an insert is disposed within the second shaft.

5. The pedestal of claim 4, wherein the insert includes one or more fluid channels formed therein.

6. The pedestal of claim 1, wherein the body includes an RF mesh and one or more lift pins movably disposed therethrough, each of the one or more lift pins having a diameter of about 0.01 inches, or less.

7. A pedestal for a semiconductor processing chamber, comprising:
- a body comprising a ceramic material;
- a plurality of heating elements encapsulated within the body;
- a first shaft coupled to the body; and
- a second shaft coupled to the first shaft, wherein the second shaft includes a plurality of fluid channels formed therein, at least a portion of the fluid channels terminating in the second shaft and at least another portion of the fluid channels terminating in the body, and wherein the first shaft is made of a first material and the second shaft is made of a second material that is different than the first material, and wherein the plurality of fluid channels comprise a first set of fluid channels and the pedestal includes a second set of fluid channels formed in the first shaft and the second shaft.

8. The pedestal of claim 7, wherein the second shaft is at least partially surrounded by a sleeve.

9. The pedestal of claim 8, wherein the sleeve is coupled to a cooling base.

10. The pedestal of claim 8, wherein the sleeve comprises a base assembly.

11. The pedestal of claim 7, wherein the second shaft comprises an insert.

12. The pedestal of claim 11, wherein the insert includes one or more fluid channels formed therein.

13. The pedestal of claim 7, wherein the body includes one or more lift pins movably disposed therethrough, each of the one or more lift pins having a diameter of about 0.01 inches, or less.

14. A pedestal for a semiconductor processing chamber, comprising:
- a body comprising a ceramic material;
- a plurality of heating elements encapsulated within the body;
- a first shaft coupled to the body; and
- a second shaft surrounded by a sleeve and coupled to the first shaft, wherein the second shaft includes a plurality of fluid channels formed therein, at least a portion of the fluid channels terminating in the second shaft, wherein the first shaft is made of a first material and the second shaft is made of a second material that is different than the first material, and wherein the plurality of fluid channels comprise a first set of fluid channels and the pedestal includes a second set of fluid channels formed in the first shaft and the second shaft.

15. The pedestal of claim 14, wherein the sleeve is coupled to a cooling base.

16. The pedestal of claim 14, wherein the sleeve comprises a base assembly.

17. The pedestal of claim 14, wherein an insert is disposed within the second shaft.

18. The pedestal of claim 17, wherein the insert includes one or more fluid channels formed therein.

* * * * *